(12) United States Patent
Tanaka et al.

(10) Patent No.: US 8,381,649 B2
(45) Date of Patent: Feb. 26, 2013

(54) PRINTING METHOD AND DISPLAY APPARATUS MANUFACTURING METHOD

(75) Inventors: Masanobu Tanaka, Kanagawa (JP); Takahiro Kamei, Kanagawa (JP)

(73) Assignee: Sony Corporation, Tokyo (JP)

( * ) Notice: Subject to any disclaimer, the term of this patent is extended or adjusted under 35 U.S.C. 154(b) by 522 days.

(21) Appl. No.: 12/646,476

(22) Filed: Dec. 23, 2009

(65) Prior Publication Data
US 2010/0173553 A1 Jul. 8, 2010

(30) Foreign Application Priority Data
Jan. 7, 2009 (JP) ................................. 2009-001248

(51) Int. Cl.
*B41F 16/00* (2006.01)
(52) U.S. Cl. ........ 101/492; 101/327; 427/98.4; 438/478
(58) Field of Classification Search ................... 101/492
See application file for complete search history.

(56) References Cited

U.S. PATENT DOCUMENTS

| | | | | |
|---|---|---|---|---|
| 5,352,634 | A * | 10/1994 | Brody | 438/478 |
| 5,358,604 | A * | 10/1994 | Lin et al. | 216/17 |
| 5,512,131 | A * | 4/1996 | Kumar et al. | 438/738 |
| 6,776,094 | B1 * | 8/2004 | Whitesides et al. | 101/327 |
| 6,966,997 | B1 * | 11/2005 | Inganas et al. | 216/36 |
| 7,406,915 | B2 * | 8/2008 | Yoo | 101/170 |
| 2007/0000403 | A1 * | 1/2007 | Yoo et al. | 101/483 |
| 2007/0157841 | A1 * | 7/2007 | Yoo et al. | 101/492 |

FOREIGN PATENT DOCUMENTS

JP 3689536 6/2005

OTHER PUBLICATIONS

Youn-Gyoung Chang et al.; Distinguished Paper: Design Parameters of Roll Printing Process for TFT-LCD Fabrication; SID 08 Digest; p. 637-640; 2008.

* cited by examiner

*Primary Examiner* — Jill Culler
(74) *Attorney, Agent, or Firm* — SNR Denton US LLP (57) ABSTRACT

A printing method including the steps of, forming a transfer layer on a blanket, forming a groove portion on the transfer layer by pressing a protrusion portion of a mold member including the protrusion portion having a predetermined pattern against the transfer layer, the groove portion having the pattern corresponding to the protrusion portion, forming a print pattern layer on the blanket by causing the transfer layer on the blanket and a relief printing plate including a convex portion having a pattern corresponding to a reverse pattern of the protrusion portion to face each other and pressure-contacting them so that a portion on the transfer layer corresponding to the convex portion is selectively eliminated, and transferring the print pattern layer onto a substrate to be printed by causing the print pattern layer on the blanket and the substrate to be printed to face each other and pressure-contacting them.

14 Claims, 11 Drawing Sheets

| PROCESS | TFT CROSS-SECTIONAL VIEW |

FIG. 14A

| a-Si/H(n+, i) LAYER RESIST PRINTING |
| a-Si/H(n+, i) LAYER DRY ETCHING |

FIG. 14B

| SOURCE-DRAIN ELECTRODE LAYER FILM FORMATION |

FIG. 14C

| SOURCE-DRAIN ELECTRODE LAYER RESIST PRINTING |
| SOURCE-DRAIN ELECTRODE LAYER WET ETCHING |

FIG. 14D

| a-Si/H(n+) LAYER DRY ETCHING |

FIG. 14E

| PASSIVATION LAYER FILM FORMATION |
| PASSIVATION LAYER RESIST PRINTING |
| PASSIVATION LAYER DRY ETCHING |

PRINTING METHOD AND DISPLAY APPARATUS MANUFACTURING METHOD

BACKGROUND OF THE INVENTION

1. Field of the Invention

The present invention relates to a printing method using a blanket and a relief printing plate, and a display apparatus manufacturing method using such a printing method.

2. Description of the Related Art

In recent years, a technical field called "printable electronics" has been significantly developed. An object of printable electronics is to manufacture expensive electronic components, which have been produced so far by fully using semiconductor manufacturing techniques, at low cost by using a printing method and a nanoimprint method. Another object is to provide a flexible device by replacing a substrate with a film.

Therefore, in the related art, various printing methods have been proposed (for example, Japanese Patent No. 3689536 and a non-patent document, Youn-Gyoung, et al. "Design Parameters of Roll Printing Process for TFT-LCD Fabrication", SID08GIGEST, p. 637-640, 2008)

SUMMARY OF THE INVENTION

In Japanese Patent No. 3689536, a method for accurately printing a resin such as a resist material by using a reverse offset printing method is proposed. Specifically, by using a resin for a color filter as an ink, a print pattern having a thickness of 0.8 µm is obtained. Although the resolution of the print pattern is not described in detail, it is expected that the target line width is at least about 50 µm because the color filter is for a liquid crystal display. In Japanese Patent No. 3689536, since there is a description "It shows that printing a line having a width of 10 µm is possible.", the dimensional limit of this printing method is estimated to be about 10 µm.

The non patent document, Youn-Gyoung, et al. "Design Parameters of Roll Printing Process for TFT-LCD Fabrication", SID08 GIGEST, p. 637-640, 2008 proposes a thin film transistor forming method which uses the reverse offset printing method. In the method, it is observed that, when a resist pattern having a film thickness of about 1 µm is printed, pattern edge blur of about 0.5 to 4.0 µm appears depending on the print direction.

As described above, in the related art, when printing an ink constituted by a resin, an organic solvent, and the like, there is a problem that the sharpness of the print pattern decreases as the film thickness increases.

The present invention is made in view of the above problem, and it is desirable to provide a printing method in which a print sharper than that of the related art can be performed independent of the film thickness of the print pattern, and a display apparatus manufacturing method using such a printing method.

The printing method according to an embodiment of the present invention includes the steps of, forming a transfer layer on a blanket, forming a groove portion on the transfer layer by pressing a protrusion portion of a mold member including the protrusion portion having a predetermined pattern against the transfer layer, the groove portion having a pattern corresponding to the protrusion portion, forming a print pattern layer on the blanket by causing the transfer layer on the blanket and a relief printing plate including a convex portion having a pattern corresponding to a reverse pattern of the protrusion portion to face each other and pressure-contacting them so that a portion on the transfer layer corresponding to the convex portion is selectively eliminated in a first transfer process, and transferring the print pattern layer onto a substrate to be printed by causing the print pattern layer on the blanket and the substrate to be printed to face each other and pressure-contacting them in a second transfer process. The "groove portion" is not limited to a pattern having an elongated shape, but may be a pattern having any shape.

The display apparatus manufacturing method according to an embodiment of the present invention includes the step of forming a display element and a thin film transistor which drives the display element on a substrate, and the above step of forming the thin film transistor includes the steps of forming a transfer layer on a blanket, forming a groove portion on the transfer layer by pressing a protrusion portion of a mold member including the protrusion portion having a predetermined pattern against the transfer layer, the groove portion having a pattern corresponding to the protrusion portion, forming a print pattern layer on the blanket by causing the transfer layer on the blanket and a relief printing plate including a convex portion having a pattern corresponding to a reverse pattern of the protrusion portion to face each other and pressure-contacting them so that a portion on the transfer layer corresponding to the convex portion is selectively eliminated in a first transfer process, transferring the print pattern layer onto the substrate as a substrate to be printed by causing the print pattern layer on the blanket and the substrate to face each other and pressure-contacting them in a second transfer process, and forming a thin film by using the print pattern layer.

In the printing method and the display apparatus manufacturing method according to an embodiment of the present invention, the protrusion portion of the mold member is pressed against the transfer layer on the blanket, so that the groove portion having the pattern corresponding to the protrusion portion is formed on the transfer layer (molding process). Thereafter, by causing the transfer layer on the blanket and the relief printing plate including the convex portion to face each other and pressure-contacting them, a portion corresponding to the convex portion on the transfer layer is selectively eliminated and the print pattern layer is formed on the blanket (first transfer process). Thereafter, by causing the print pattern layer on the blanket and the substrate to be printed to face each other and pressure-contacting them, the print pattern layer is transferred onto the substrate to be printed (second transfer process). In this way, the groove portion is formed on the transfer layer by using the mold member, and thereafter the first transfer process is performed by using the relief printing plate, so that, even when the film thickness of the transfer layer (print pattern layer) is large, the portion corresponding to the convex portion on the transfer layer can be sheared easier than the related art.

According to the printing method and the display apparatus manufacturing method of an embodiment of the present invention, the groove portion having a pattern corresponding to the protrusion portion is formed on the transfer layer by pressing the protrusion portion of the mold member against the transfer layer on the blanket, and thereafter, the portion corresponding to the convex portion in the transfer layer is selectively eliminated and the print pattern layer is formed on the blanket by causing the transfer layer on the blanket and the relief printing plate including the convex portion to face each other and pressure-contacting them, so that the portion corresponding to the convex portion on the transfer layer can be easily sheared even when the thickness of the transfer layer (print pattern layer) is large. Therefore, a print sharper than that in the related art can be performed independent of the film thickness of the print pattern.

DESCRIPTION OF THE PREFERRED EMBODIMENTS

Hereinafter, an embodiment of the present invention will be described in detail with reference to the drawings. The embodiment will be described in the following order.
1. Embodiment (process example of a printing method using a mold)
2. Example
3. Modified example and application example
<1. Embodiment>
[Process Example of a Printing Method Using a Mold]

FIGS. 1 to 5 are cross sectional-views for explaining a printing method according to an embodiment of the present invention.
(Transfer Layer Forming Process (Coating Process))

Figure 1A:
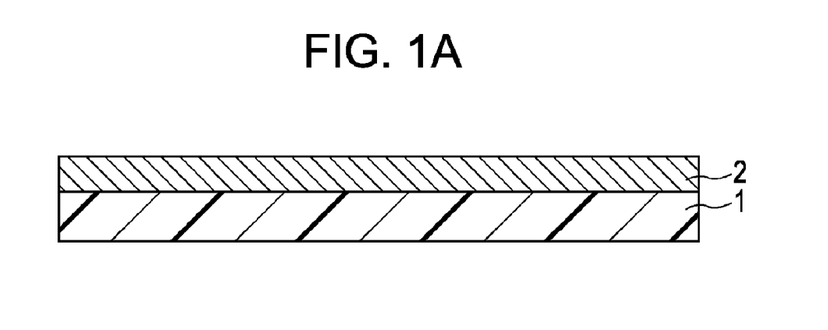
FIG. 1 is a cross sectional-view showing a part of a main process of a printing method according to an embodiment of the present invention.

First, as shown in FIG. 1A, by coating an ink 2 on a flat plate blanket 1, a transfer layer constituted by the ink 2 is formed on the flat plate blanket 1.

The flat plate blanket 1 has to be able to be transformed flexibly in order to realize a good contact with a substrate to be printed (substrate 4) described below. Therefore, as a mechanical property of the flat plate blanket 1, the Young's modulus is preferably about 0.01 to 10 MPa. In view of the coating property and peeling property of the ink 2, the surface tension of the flat plate blanket 1 is preferably 15 to 40 dyn/cm. As a material satisfying the above properties, a silicone rubber, a fluorine resin, or the like can be used as a material of the flat plate blanket 1.

As the ink 2, a mixture of at least one of a resin, a metal powder, and an oxide powder can be used, and 0.1 to 90 w % low polarity solvent is included therein as a solvent. As a low polarity solvent as described above, for example, a mixed solvent including at least one of straight-chain alkanes, aromatic hydrocarbons, esters, alkyl halides, an ester compound, and a cyclic ether compound can be used. The viscosity of the ink 2 is preferably about 1.0 to 150,000 mPa at normal temperature (25° C.)

As a method for coating the ink 2 on the flat blanket 1, for example, a spin coating method, a die coating method, a gravure coating method, a CAP coating method, and the like are preferred.
(Molding Process)

Figure 1B:
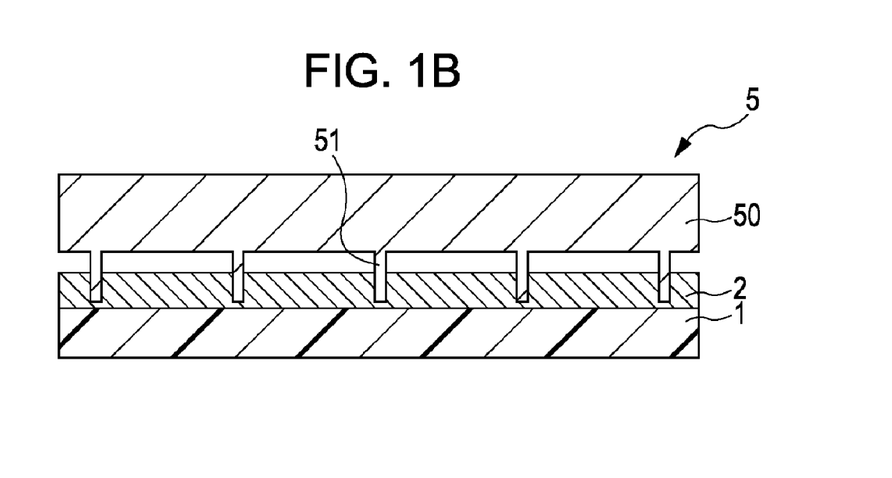
Figure 1C:
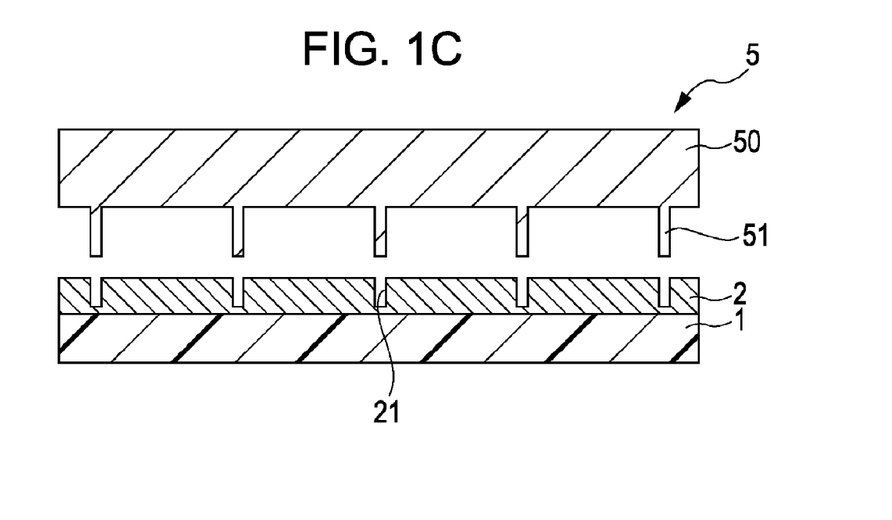
Figure 2:
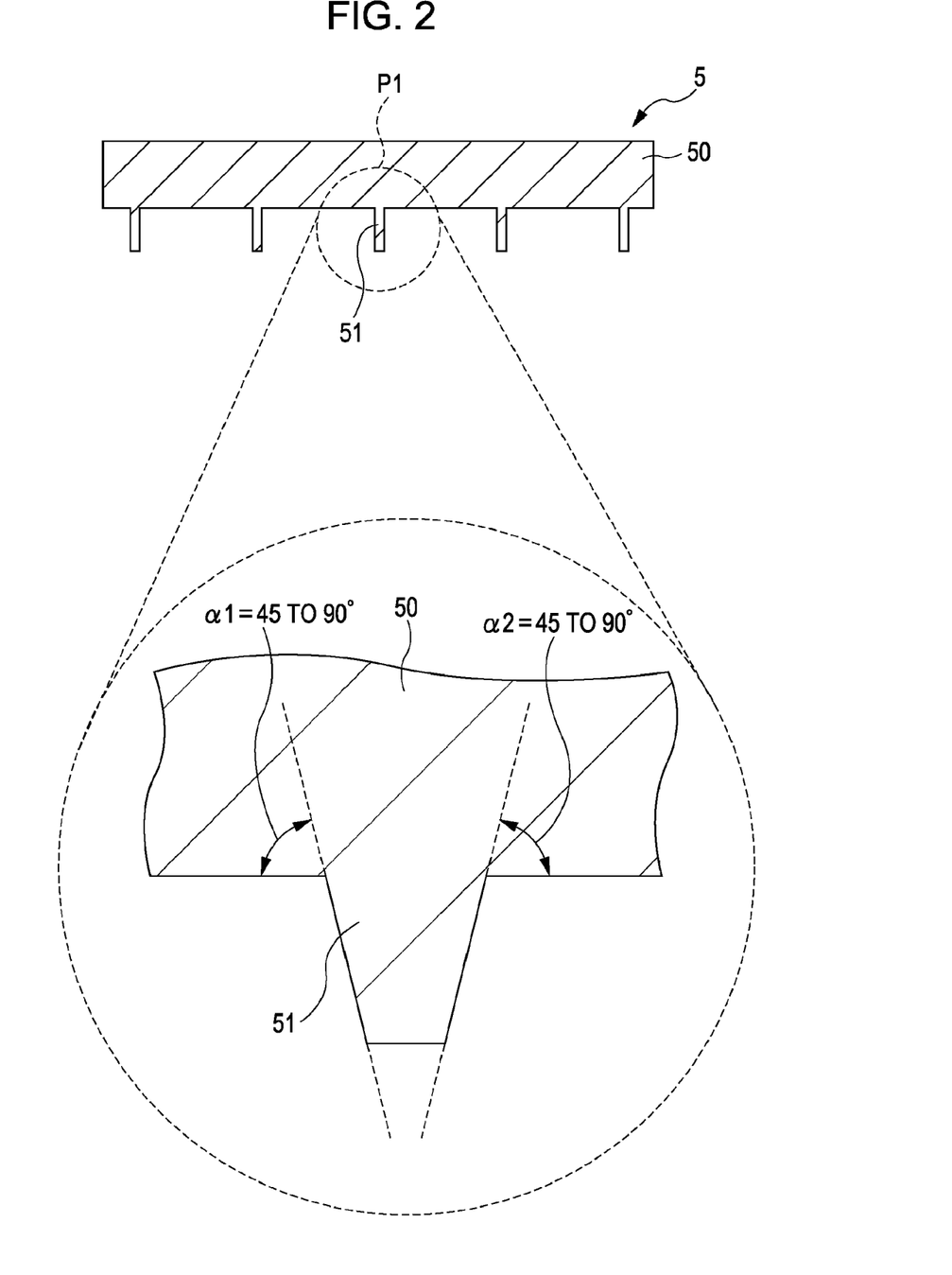
FIG. 2 is an enlarged cross sectional-view showing a detailed structure of a mold shown in FIG. 1.

Next, as shown in FIG. 1B, a protrusion portion 51 of a mold (mold member) including the protrusion portion 51 having a predetermined pattern is pressed against the ink 2 (transfer layer) on the flat plate blanket 1. In this way, for example, as shown in FIG. 1C, when removing the mold 5 from the ink 2, a groove portion 21 having a pattern corresponding to the pattern of the protrusion portion 51 is formed on the ink 2.

The mold 5 has to have rigidity for molding the ink 2. Specifically, the material of the mold 5 preferably has a Young's modulus of about 1 to 500 GPa. For example, as shown by a symbol P1 in FIG. 2, inclination angles $\alpha 1$ and $\alpha 2$ of the protrusion portion 51 with respect to the base body 50 are preferably in a range of 45° to 90°, and it is more preferable that both $\alpha 1$ and $\alpha 2$ are 90° because a molding defect is effectively prevented.

The mold 5 has to have a peeling property with respect to the ink 2. Specifically, to secure a peeling property with respect to the ink 2 coated on the flat plate blanket 1 having a low surface tension, the mold 5 preferably has a surface tension equal to or smaller than that of the flat plate blanket 1 (for example, about 15 to 40 dyn/cm).
(First Transfer Process (Eliminating Process))

Figure 3A:
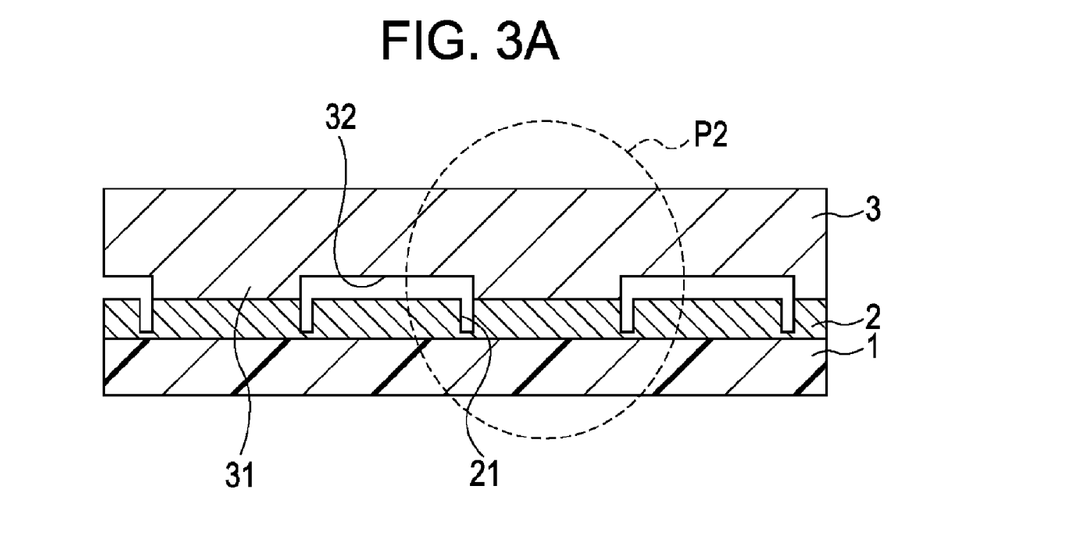
FIG. 3 is a cross sectional-view showing a process following the process of FIG. 1.
Figure 3B:
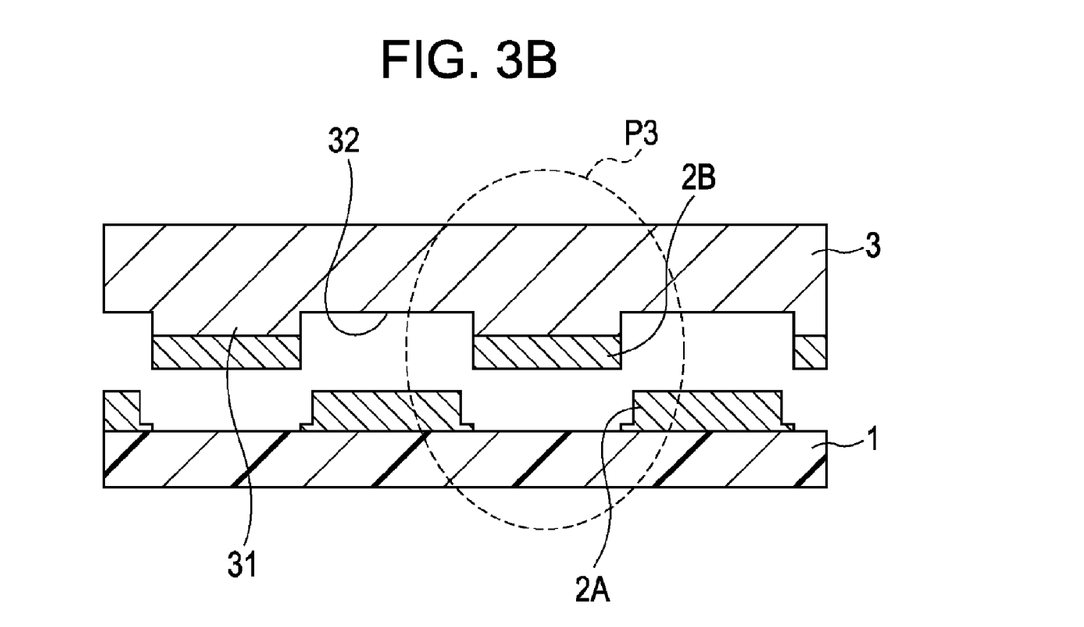

Next, as shown in FIG. 3A, the flat plate blanket 1 and a relief printing plate 3 including a convex portion 31 having a predetermined pattern (a pattern corresponding to a reverse pattern of the protrusion portion 51) are arranged so as to face each other and made to contact each other. In this way, for example, as shown in FIG. 3B, when separating the flat plate blanket 1 and the relief printing plate 3 that are in contact with each other, a portion corresponding to the convex portion 31 in the ink 2 (a portion of an ink 2B in FIG. 3B) is selectively eliminated from the flat plate blanket 1. On the other hand, the ink 2 remains in an area which is not transferred by the relief printing plate 3 (a portion of an ink 2A in FIG. 3B) on the flat plate blanket 1, so that a print pattern 2A is formed on the flat plate blanket 1.

Figure 4A:
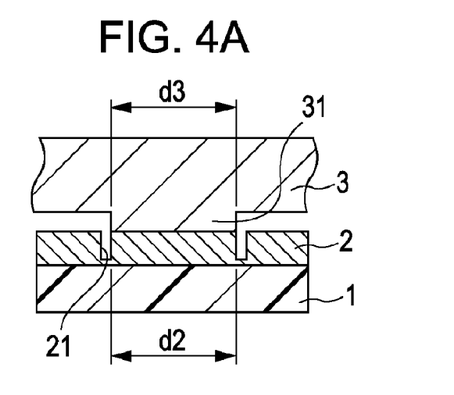
FIG. 4 is a cross sectional-view for explaining a relationship between a distance between slits formed on an ink and a width of a convex portion of a relief printing plate.
Figure 4B:
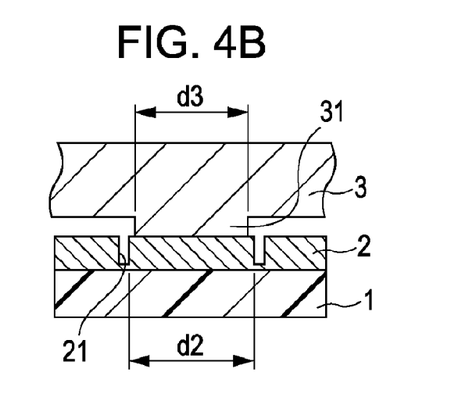
Figure 4C:
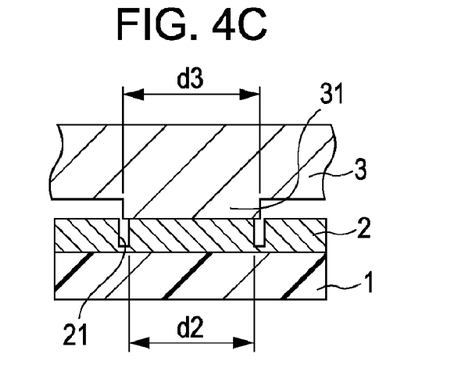

The shape of the relief printing plate 3 corresponds to a pattern for eliminating the ink 2 (reverse pattern of the convex portion 51) as shown in FIG. 3A and FIGS. 4A to 4C (enlarged views of a portion indicated by a symbol P2 in FIG. 3A). Specifically, first, as shown in FIGS. 3A and 4A, there is a case in which the width of the ink pattern to be eliminated (distance d2 between the grooves 21) is the same as the width d3 of the convex portion 31. However, for example, as shown in FIG. 4A, the width d3 of the convex portion 31 may be smaller than the width of the ink pattern to be eliminated (distance d2 between the grooves 21). On the contrary, for example, as shown in FIG. 4C, the width d3 of the convex portion 31 may be greater than the width of the ink pattern to be eliminated (distance d2 between the grooves 21), to an extent that the ink 2 is not divided.

To successfully eliminate the ink 2 from the flat plate blanket 1, the surface tension of the relief printing plate 3 has to be higher than that or the flat plate blanket 1, and is preferably about 40 to 80 dyn/cm. In addition, when washing away the ink 2B eliminated from the flat plate blanket 1 using an organic solvent or the like, the relief printing plate 3 has to have durability. Therefore, the material of the relief printing plate 3 is preferably an oxide, a metal, or the like.

When making the flat plate blanket 1 and the relief printing plate 3 contact each other, pressure compression is used (a compressed gas pressure method is used). The compressed gas pressure method is a method in which the flat plate blanket 1 and the relief printing plate 3 are arranged so as to face each other, are brought together, and each fixed onto a predetermined stage. Then, a compressed gas is jetted from a position to the rear of either one of the flat plate blanket 1 and the relief printing plate 3, and pushes the flat plate blanket 1 or the relief printing plate 3, so that the flat plate blanket 1 and the relief printing plate 3 are made to contact each other. At this time, the space formed between the pushed object and the stage that is the supply source of the compressed gas is hermetically sealed (the space indicated by the arrow P4 in FIG. 5 described below).

Figure 5:
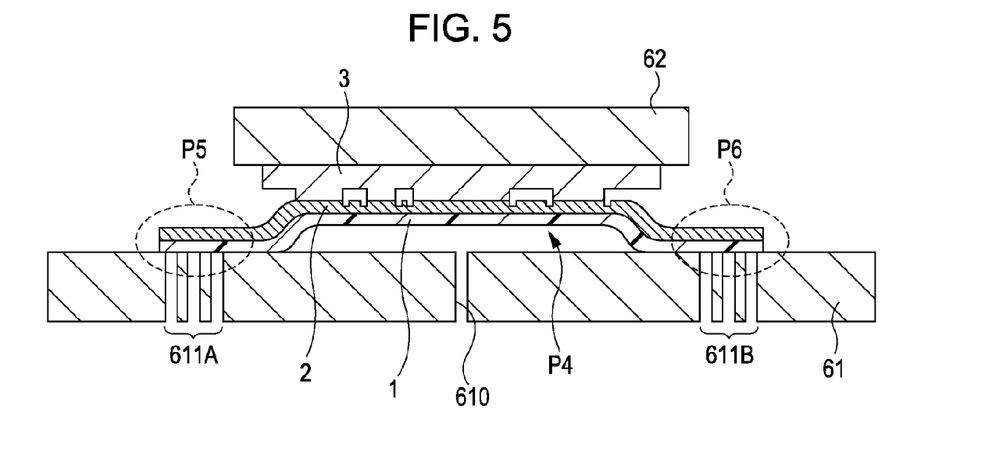
FIG. 5 is a cross sectional-view showing an example of a contact method between a flat plate blanket and the relief printing plate.

Specifically, as shown in FIG. 5, the outer periphery of the flat plate blanket 1 is mechanically fixed to a lower stage 61, and vacuum-contacted and fixed by opening portions 611A and 611B provided in the lower stage 61 as indicated by symbols P5 and P6 in FIG. 5. The relief printing plate 3 is fixed to the upper stage 62, and the compressed gas is injected from an opening portion 610 (functioning as a vacuum exhaust opening and a compressed gas injecting opening) provided near the center of the lower stage 61 so that the flat plate blanket is pushed out. In this case, the distance between the flat plate blanket 1 and the relief printing plate 3 which are made to approach each other is accurately controlled to be 1 μm to 1 mm, and the transfer pressure is also accurately controlled to be about 0.1 kPa to 100 kPa. In this way, since control with a low and even pressure can be performed on the flat plate blanket 1, an ink 2 transfer without crushing ink is possible.

(Second Transfer Process (Transfer Process))

Figure 6A:
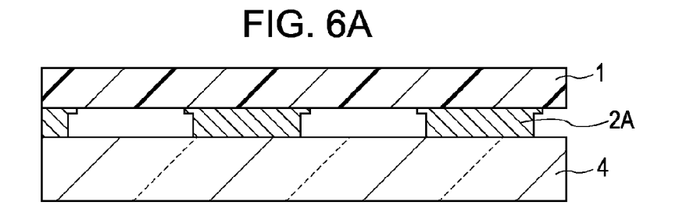
FIG. 6 is a cross sectional-view showing a process following the process of FIG. 3.
Figure 6B:
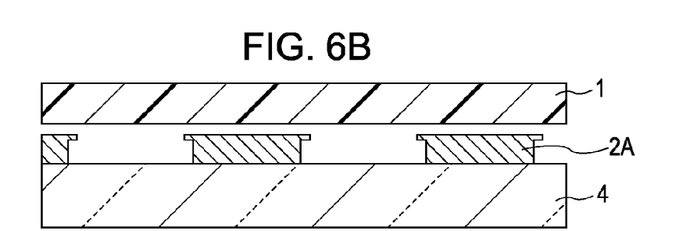

Next, as shown in FIG. 6A, a print pattern layer 2A on the flat plate blanket 1 and the substrate 4 as a substrate to be printed are arranged so as to face each other and made to contact each other. In this way, for example, as shown in FIG. 6B, when separating the flat plate blanket 1 and the substrate 4 which are in contact with each other, the print pattern layer 2A is transferred onto the substrate 4. When making the flat plate blanket 1 and the substrate 4 contact each other, as described above, pressure compression is used (the compressed gas pressure method is used).

As the substrate 4, for example, a substrate made of a material such as silicon, synthetic quartz, glass, metal, resin, resin film, or the like can be used.

Figure 6C:
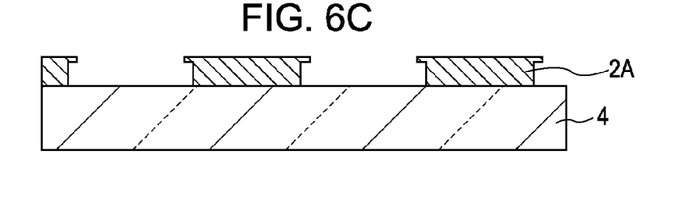

In this way, for example, as shown in FIG. 6C, the print pattern 2A corresponding to the reverse pattern of the convex portion 31 is formed on the relief printing plate 3 on the substrate 1.

In the printing method as described above, when a thin film forming material is used as the ink 2 which constitutes the transfer layer to form the transfer layer, the print pattern layer 2A is directly formed into a thin film. In this case, as the thin film forming material, for example, a material which may include an acrylic resin, an epoxy resin known as a thermoplastic resin, and a resin including a polyimide resin, a siloxane resin, a fluorine resin, and the like may be used.

In the printing method as described above, before the second transfer process shown in FIGS. 6A and 6B, a thin film may be evenly formed on the substrate 4 in advance and the print pattern layer 2A may be transferred onto the thin film in the second transfer process. In this case, as the ink 2 constituting the transfer layer, a photoresist material used for etching the thin film is used. Also, when doing so, by etching the thin film using the print pattern 2A on the substrate 4 after the second transfer process, a thin film having a pattern corresponding to the print pattern 2A can be formed.

[Operation and Effects of the Printing Method]

Comparative Example

Figure 7A:
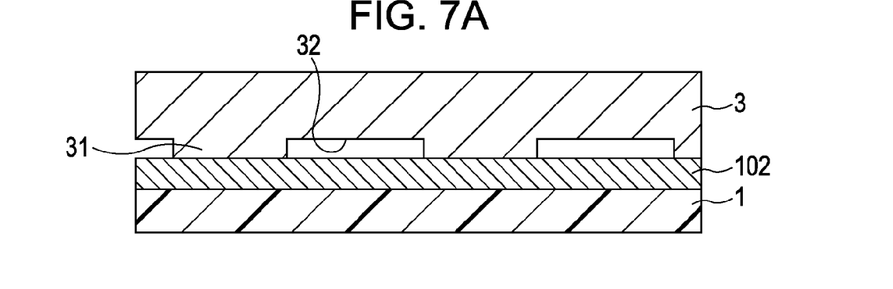
FIG. 7 is a cross sectional-view showing a part of a process of a printing method according to a comparative example.
Figure 7B:
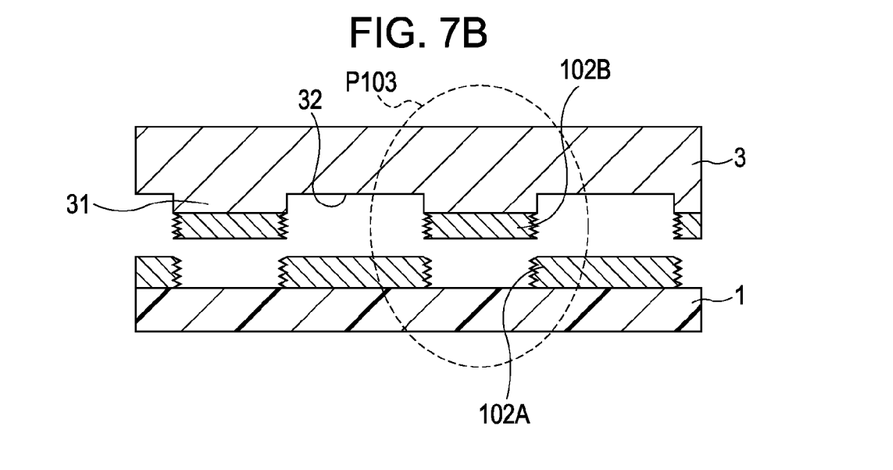

In a printing method of a comparative example in the related art, for example, as shown in FIGS. 7A and 7B, the molding process of the embodiment is not performed. Specifically, just after the transfer layer forming process (coating process) shown in FIG. 1A, the first transfer process (eliminating process) shown in FIGS. 7A and 7B is performed.

Figure 8A:
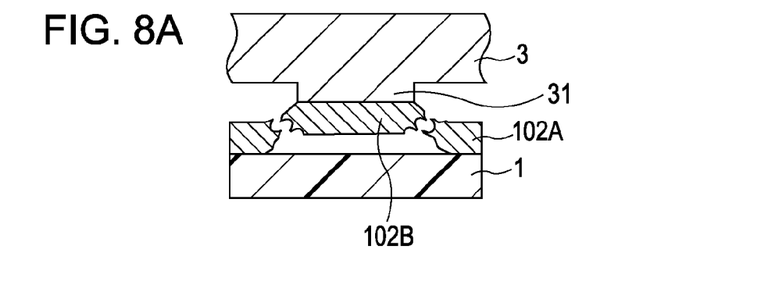
FIG. 8 is cross sectional-views for explaining an ink separation form in a first transfer process of the printing method according to the comparative example and the embodiment.

Therefore, for example, as shown in FIGS. 7A and 8A (corresponding to an enlarged view of a portion indicated by symbol P103 in FIG. 7A), when the thickness of an ink 102 (print pattern layer 102A) is large, a portion corresponding to the convex portion 31 (a portion of an ink 102B) is difficult to shear. Specifically, since the shear stress increases in relation to the film thickness of the ink 102, the cut surface has a rough shape. Therefore, as the film thickness of the ink 102 (print pattern layer 102A) increases, the sharpness of the print pattern decreases.

On the other hand, in the printing method of the embodiment, the protrusion portion 51 of the mold 5 is pressed against the ink 2 on the flat plate blanket 1 in the molding process, so that the groove portion 21 having the pattern corresponding to the protrusion portion 51 is formed on the ink 2. Thereafter, in the first transfer process (eliminating process), the ink 2 on the flat plate blanket 1 and the relief printing plate 3 are pressure-contacted, so that a portion corresponding to the convex portion 31 on the ink 2 is selectively eliminated, and the print pattern layer 2A is formed on the flat plate blanket 1.

Figure 8B:
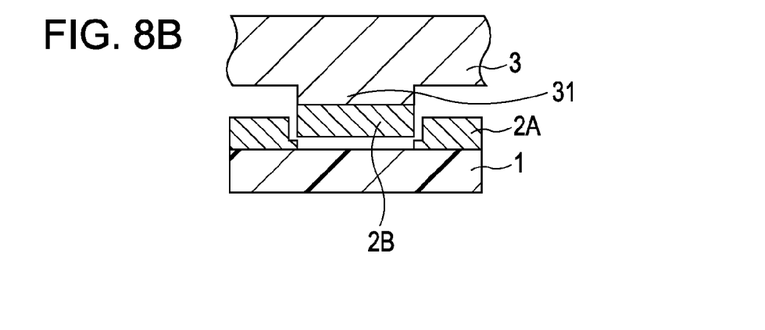

As described above, the groove portion 21 is formed on the ink 2 by using the mold 5, and thereafter the first transfer process is performed by using the relief printing plate 3, so that, when eliminating the unwanted ink 2B in the first transfer process, the area of the groove portion 21 is preferentially cut. In this way, a desired pattern of the ink 2 can be prevented from deforming. Therefore, for example, as shown in FIGS. 3B and 8B (corresponding to an enlarged view of a portion indicated by symbol P3 in FIG. 3B), even when the thickness of the ink 2 (print pattern layer 2A) is large, a portion corresponding to the convex portion 31 in the ink 2 is easily sheared.

As described above, in the embodiment, the groove portion 21 having a pattern corresponding to the protrusion portion 51 is formed on the ink 2 by pressing the protrusion portion 51 of the mold 5 against the ink 2 on the flat plate blanket 1, and thereafter, the portion corresponding to the convex portion 31 in the ink 2 is selectively eliminated and the print pattern layer 2A is formed on the flat plate blanket 1 by pressure-contacting the ink 2 on the flat plate blanket 1 and the relief printing plate 3, so that the portion corresponding to the convex portion 31 in the ink 2 can be easily sheared even when the thickness of the ink 2 (print pattern layer 2A) is large. Therefore, printing at a higher resolution than that in the related art can be performed independent of the film thickness of the print pattern.

<2. Example>

Hereinafter, a specific example of the present invention will be described. Here, an example will be described in which a photoresist AZ1500 (product name; manufactured by AZ Electric Materials) is printed as the print pattern layer 2A on the substrate 4.

(Transfer Layer Forming Process (Coating Process))

The flat plate blanket 1 was formed by performing spin coating of 200 μm by using a silicone rubber layer on a glass having a thickness of 0.2 mm. The photoresist AZ1500 (20 cP) (manufactured by AZ Electric Materials) was used as the ink 2. The ink 2 is coated on the flat plate blanket 1 by a CAP coater, and the film thickness of the ink 2 was 3 μm.

(Molding Process)

The mold 5 was made by patterning a quartz glass by using a photolithography method. Specifically, a pattern having a line/space of 1 μm/3 μm was made by a dry etching method. At this time, the height of a line pattern was 5 μm. Thereafter, water repellent processing was performed by dipping and drying the mold 5 in a fluorochemical surface coating material KP-801M. At this time, the surface tension of the mold 5 was 20 dyn/cm. The molding process was performed by overlapping the mold 5 and the flat plate blanket 1, and pressing them by a pressure of 1 MPa for 10 minutes. Thereafter, when the mold 5 was peeled from the flat plate blanket 1, the groove portion 21 was formed on an area where the mold 5 is pressed.

(First Transfer Process (Eliminating Process))

The relief printing plate 3 was made by patterning a quartz glass by using a photolithography method. Specifically, a pattern having a line/space of 3 μm/4 μm was made by a dry etching method. At this time, the height of a line pattern was 1 μm. The eliminating process was performed by positioning and overlapping the relief printing plate 3 and the flat plate blanket 1, and pressing them. When doing so, they were pressed by a pressure of 10 kPa for one minute, and then peeled from each other. In this way, the unwanted ink 2B was eliminated from the flat plate blanket 1, and a desired pattern remained on the flat plate blanket 1.

(Second Transfer Process (Transfer Process))

The pattern remained on the flat plate blanket 1 was transferred onto a glass substrate as the substrate 4. Specifically, the pattern was transferred by positioning and overlapping the substrate 4 and the flat plate blanket 1, and pressing them. When doing so, they were pressed by a pressure of 10 kPa for one minute, and then peeled from each other. In this way, the ink 2A was transferred from the flat plate blanket 1 made of silicone rubber onto the glass substrate as the substrate 4.

By doing the above processes, a fine pattern having a film thickness of 3 μm and a pattern line width of 3 μm could be obtained as a print pattern of the AZ1500.

<3. Modified Example and Application Example>

Although, the present invention has been described using the embodiment and the example, the present invention is not limited to the embodiment or the like, and various modifications are possible.

Figure 9:
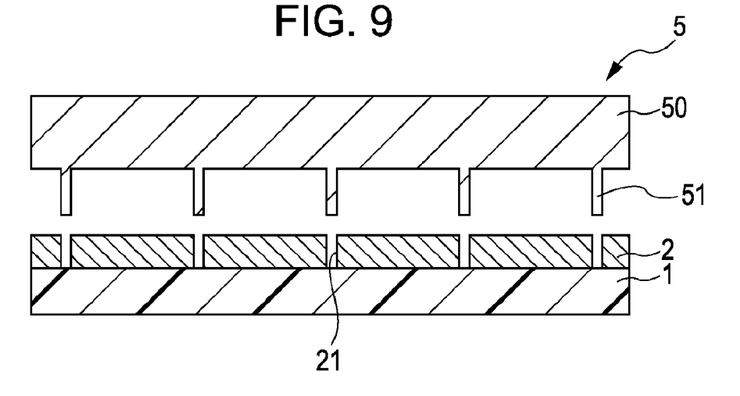
FIG. 9 is a cross sectional-view showing a part of a process of the printing method according to a modified example of the present invention.
Figure 10:
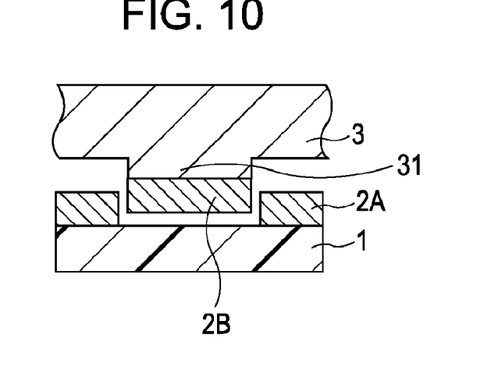
FIG. 10 is a cross sectional-view showing an ink separation form in the first transfer process of the printing method shown in FIG. 9.
Figure 11:
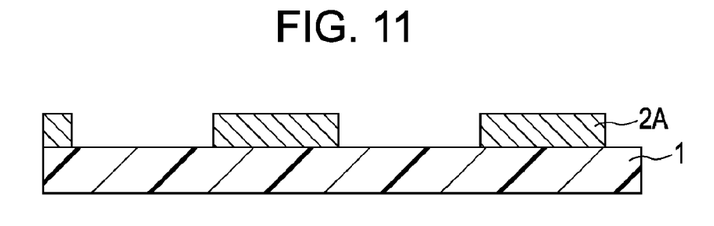
FIG. 11 is a cross sectional-view showing an example of a print pattern formed by the printing method shown in FIG. 9.

For example, although, in the embodiment or the like, a case has been described in which the groove portion 21 formed on the ink 2 has a concave shape, for example, as shown in FIG. 9, the groove portion 21 penetrating to the surface of the flat plate blanket 1 may be formed. When the groove portion 21 penetrates to the surface as described above, for example, as shown in FIG. 10, a portion corresponding to the convex portion 31 in the ink 2 can be sheared more easily. The print pattern 2A formed in this case has, for example, a cross sectional shape as shown in FIG. 11.

Although, the above embodiment or the like has been described using the flat plate blanket as an example of the blanket, a blanket having another shape (for example, a roll shape or the like) may be used in the printing method of the present invention.

In addition, the material and the thickness of the constituent elements described in the above embodiment or the like, or the film forming method and the film forming condition are not limited, and another material or another thickness may be used, and another film forming method and another film forming condition may be used.

(Application Example to a Thin Film Transistor Forming Method)

In addition, the print pattern formed by an embodiment of the present invention can be applied to an electronic device which uses such a print pattern (for example, a thin film transistor and a capacitor). Also, the print pattern can be applied to a display apparatus including such a thin film transistor or the like and a display element (for example, a liquid crystal display apparatus, an organic EL display, and the like). Specifically, in a manufacturing method of such a display apparatus, the print pattern layer 2A is formed by using a printing method of the above embodiment or the like and a thin film may be formed by using the print pattern layer 2A in a process for forming the thin film transistor.

FIGS. 12 to 15 show a part of a main process of the thin film transistor forming method using the printing method according to an embodiment of the present invention. FIGS. 12 and 14 show cross sectional-views and FIGS. 13 and 15 show upper views. In the processes shown in FIGS. 12 and 14, hatched processes (processes shown in FIGS. 12C, 12G, 14A, 14C, 14E) are processes which use the printing method of an embodiment of the present invention.

Figure 12A:
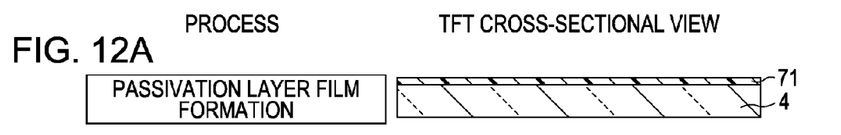
FIG. 12 is a cross sectional-view showing a part of a main process of a thin film transistor forming method using the printing method according to an embodiment of the present invention.
Figure 12B:
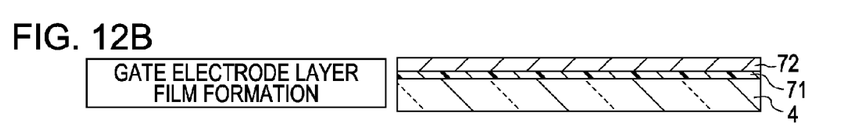
Figure 12C:
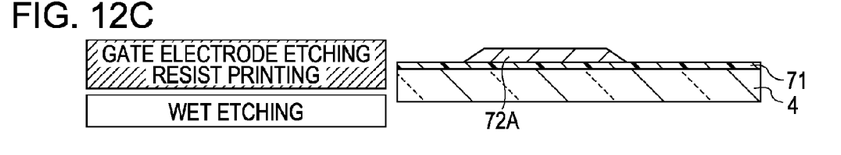
Figure 12D:
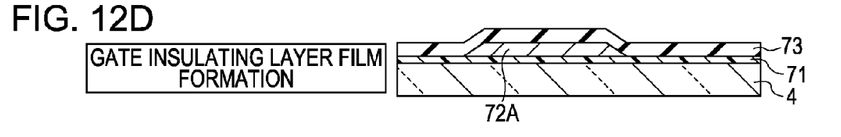
Figure 12E:
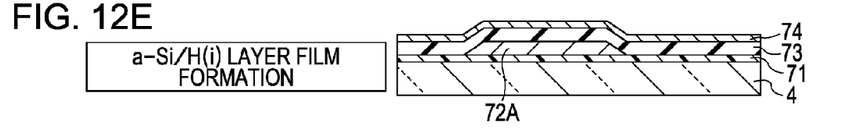
Figure 12F:
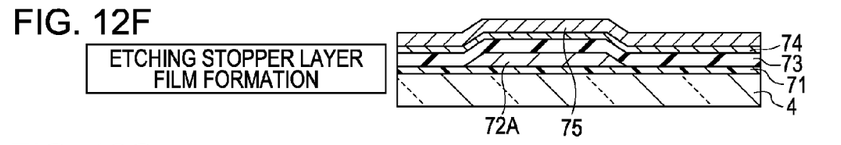
Figure 12G:
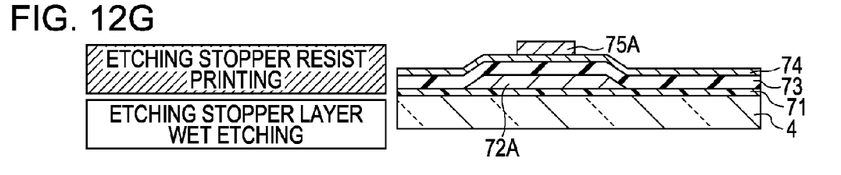
Figure 12H:
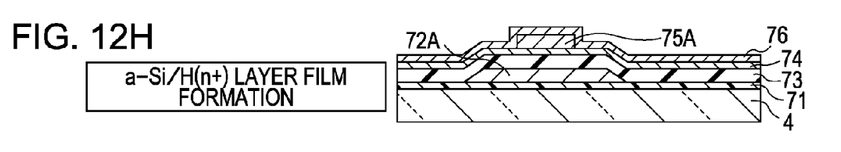
Figure 13A:
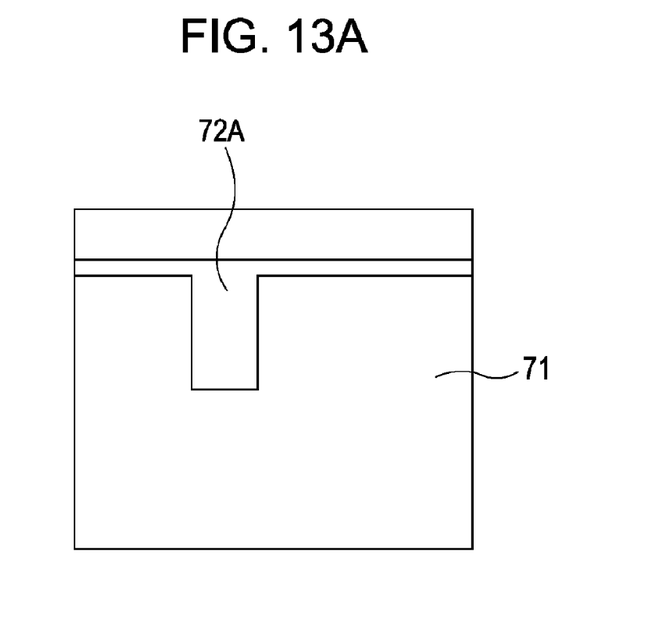
FIG. 13 is an upper view showing a part of the process shown in FIG. 12.
Figure 13B:
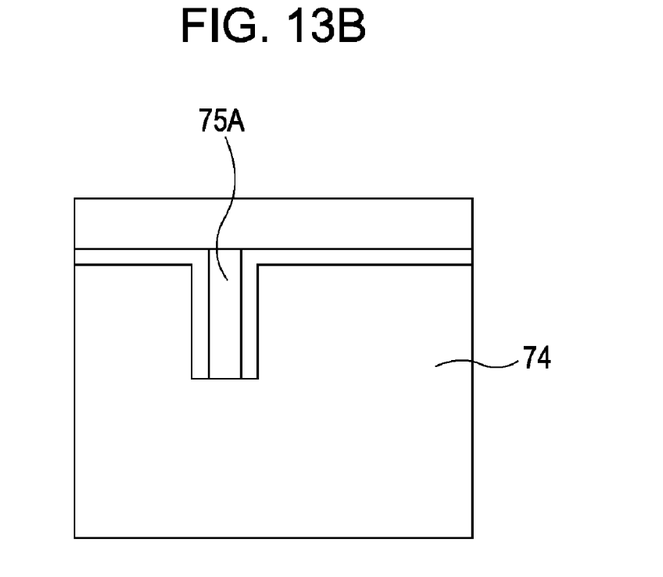

In the thin film transistor forming method, first, a passivation layer 71 is formed on the substrate 4 (FIG. 12A), thereafter a gate electrode layer 72 is formed on the passivation layer 71 (FIG. 12B). Next, by using the printing method according to an embodiment of the present invention, an etching resist layer (not shown in FIG. 12) for a gate electrode is printed on the gate electrode layer 72, and wet etching is performed. In this way, a patterned gate electrode 72A is formed (FIGS. 12C, 13A). Next, a gate insulating film 73 is formed on the passivation layer 71 and the gate electrode 72A (FIG. 12D), thereafter an a-Si/H(i) layer 74 is formed on the gate insulating film 73 (FIG. 12E). Thereafter, an etching stopper layer 75 is formed on the a-Si/H(i) layer 74 (FIG. 12F). By using the printing method according to an embodiment of the present invention, an etching stopper resist layer (not shown in FIG. 12) is printed on the etching stopper layer 75, and wet etching is performed. In this way, an etching stopper layer 75A is selectively provided on an area corresponding to a channel layer (FIGS. 12G, 13B). Next, an a-Si/H(n+) layer 76 is formed on the a-Si/H(i) layer 74 and the etching stopper layer 75A (FIG. 12H).

Figure 14A:
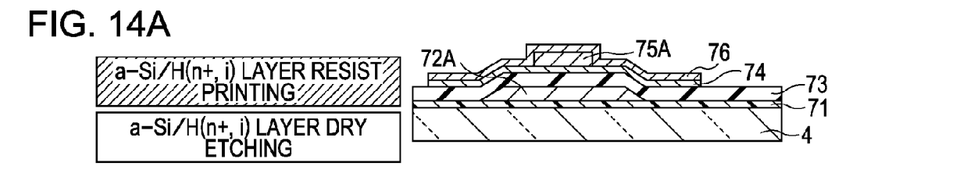
FIG. 14 is a cross sectional-view showing a process following the process of FIG. 12.
Figure 14B:
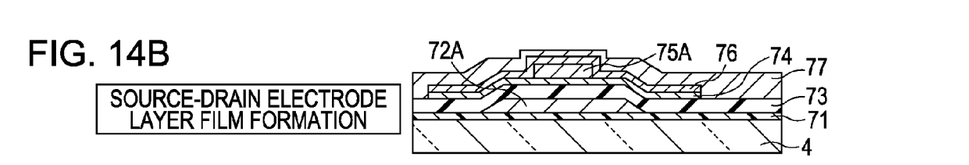
Figure 14C:
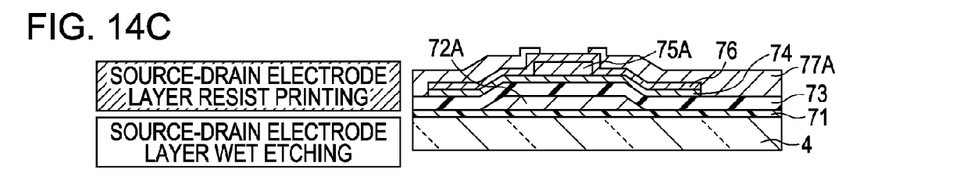
Figure 14D:
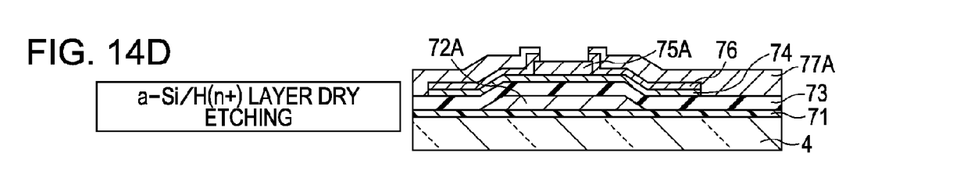
Figure 14E:
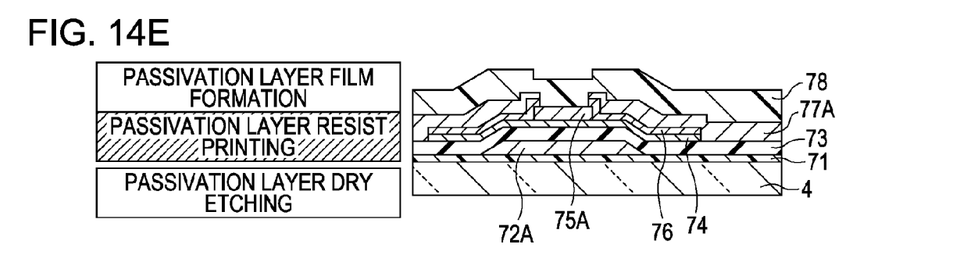
Figure 15A:
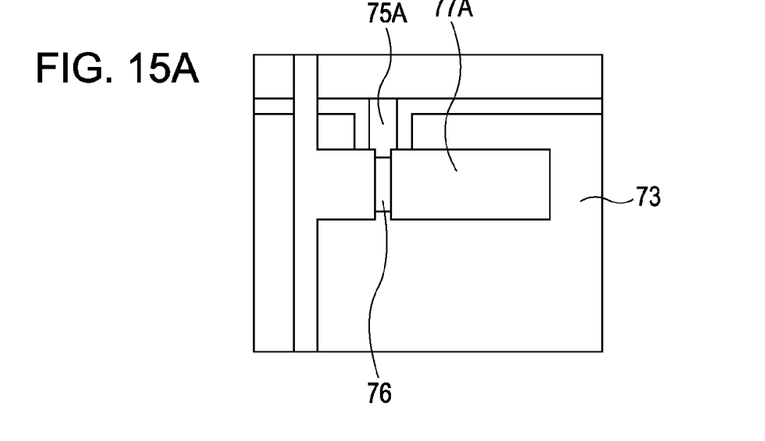
FIG. 15 is an upper view showing a part of the process shown in FIG. 14.
Figure 15B:
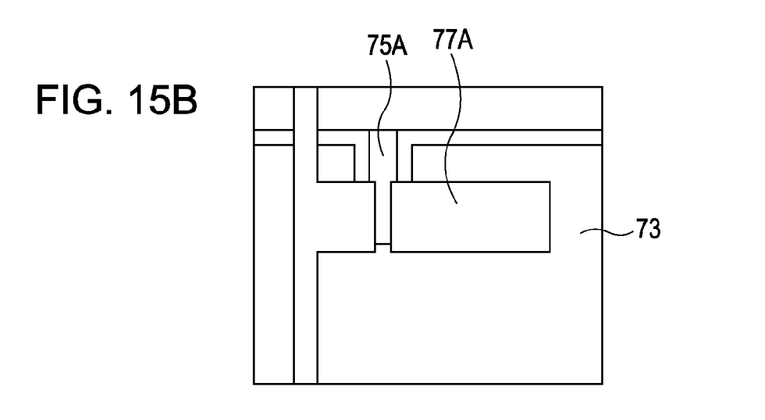
Figure 15C:
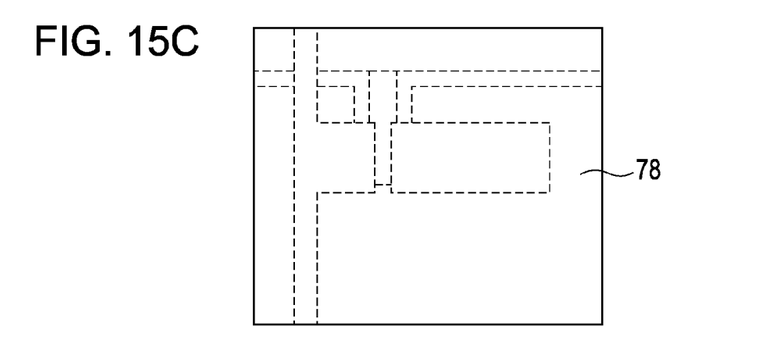

By using the printing method according to an embodiment of the present invention, a resist layer (not shown in FIG. 12) for an a-Si/H(n+, i) layer is printed on the a-Si/H(n+) layer 76, and wet etching is performed. In this way, the a-Si/H(i) layer 74 and the a-Si/H(n+) layer 76 are selectively provided on an area corresponding to the gate electrode 72A (FIG. 14A). Next, a source-drain electrode layer 77 is formed on the gate insulating film 73, the a-Si/H(i) layer 74, and the a-Si/H(n+) layer 76 (FIG. 14B). By using the printing method according to an embodiment of the present invention, a resist layer (not shown in FIG. 14) for the source-drain electrode layer is printed on the source-drain electrode layer 77, and wet etching is performed. In this way, a source-drain electrode 77A is formed (FIGS. 14C, 15A). Next, by performing dry etching on the a-Si/H(n+) layer 76, the a-Si/H(n+) layer 76 on the etching stopper layer 75A is selectively eliminated (FIGS. 14D, 15B). Next, a passivation layer 78 is formed, and thereafter, by using the printing method according to an embodiment of the present invention, a resist layer (not shown in FIG. 14) for the passivation layer is printed on the passivation layer 78, and dry etching is performed. By performing the above processes, the thin film transistor using the printing method according to an embodiment of the present invention is formed (FIGS. 14E, 15C).

The present application contains subject matter related to that disclosed in Japanese Priority Patent Application JP 2009-001248 filed in the Japan Patent Office on Jan. 7, 2009, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A method comprising the steps of:
    forming a transfer layer on a blanket;
    forming a groove portion on the transfer layer by pressing a protrusion portion of a mold member against the transfer layer in a molding process, the protrusion portion having a predetermined pattern, and the groove portion having a pattern corresponding to the protrusion portion;
    forming a print pattern layer on the blanket by pressing together the transfer layer and a relief printing plate facing toward each other, the relief printing plate including a convex portion that has a reverse pattern with respect to a part of the protrusion portion, and selectively eliminating a portion on the transfer layer corresponding to the convex portion in a first transfer process; and
    transferring the print pattern layer onto a substrate to be printed by pressing together the print pattern layer and the substrate facing toward each other in a second transfer process.

2. A method according to claim 1, wherein in the molding process, the groove portion is formed to penetrate to a surface of the blanket.

3. A method according to claim 1, wherein in the molding process, the mold member has a surface tension smaller than or equal to that of the blanket.

4. A method according to claim 1, wherein in the molding process, the mold member has an inclination angle of the protrusion portion against a base body greater than or equal to 45° and smaller than or equal to 90°.

5. A method according to any one of claims 1 to 4, wherein the transfer layer comprises a thin film forming material, and a thin film is constituted by the print pattern layer.

6. A method according to claim 5, wherein the thin film forming material comprises a resin.

7. A method according to any one of claims 1 to 4, wherein
    a thin film is evenly formed on the substrate before the second transfer process,
    the print pattern layer is transferred onto the thin film in the second transfer process, and
    the transfer layer is formed by etching the thin film using a photoresist material.

8. A method according to claim 7, wherein after the second transfer process, the thin film is etched using a print pattern on the substrate.

9. A method for manufacturing a display apparatus comprising forming a display element and a thin film transistor which drives the display element on a substrate, wherein the step of forming the thin film transistor includes the steps of:
    forming a transfer layer on a blanket;
    forming a groove portion on the transfer layer by pressing a protrusion portion of a mold member against the transfer layer in a molding process, the protrusion portion having a predetermined pattern, and the groove portion having a pattern corresponding to the protrusion portion;
    forming a print pattern layer on the blanket by pressing together the transfer layer and a relief printing plate facing toward each other, the relief printing plate including a convex portion that has a reverse pattern with respect to a part of the protrusion portion, and selectively eliminating a portion on the transfer layer corresponding to the convex portion in a first transfer process;
    transferring the print pattern layer onto the substrate as a substrate to be printed by pressing together the print pattern layer and the substrate facing toward each other in a second transfer process; and
    forming a thin film by using the print pattern layer.

10. A method according to claim 9, wherein in the molding process, the groove portion is formed to penetrate to a surface of the blanket.

11. A method according to claim 9, wherein in the molding process, the mold member has a surface tension smaller than or equal to that of the blanket.

12. A method according to claim 9, wherein in the molding process, the mold member has an inclination angle of the protrusion portion against a base body greater than or equal to 45° and smaller than or equal to 90°.

13. A method according to any one of claims 9 to 12, wherein the transfer layer comprises a thin film forming material.

14. A method according to claim 13, wherein the thin film forming material comprises a resin.

* * * * *